(12) United States Patent
Navarro et al.

(10) Patent No.: US 12,628,574 B2
(45) Date of Patent: May 12, 2026

(54) PHASE CHANGE MEMORY DEVICE

(71) Applicant: Commissariat à l'Énergie Atomique et aux Énergies Alternatives, Paris (FR)

(72) Inventors: Gabriele Navarro, Grenoble (FR); Chiara Sabbione, Grenoble (FR); Guillaume Bourgeois, Grenoble (FR); Anna-Lisa Serra, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 598 days.

(21) Appl. No.: 17/531,875

(22) Filed: Nov. 22, 2021

(65) Prior Publication Data

US 2022/0165945 A1     May 26, 2022

(30) Foreign Application Priority Data

Nov. 23, 2020     (FR) ...................................... 2012027

(51) Int. Cl.
| | |
|---|---|
| *H10N 70/20* | (2023.01) |
| *G11C 13/00* | (2006.01) |
| *H10N 70/00* | (2023.01) |

(52) U.S. Cl.
CPC ....... *H10N 70/231* (2023.02); *G11C 13/0004* (2013.01); *G11C 13/0069* (2013.01); *H10N 70/021* (2023.02); *H10N 70/041* (2023.02); *H10N 70/826* (2023.02); *H10N 70/8413* (2023.02); *H10N 70/881* (2023.02)

(58) Field of Classification Search
CPC ............. G11C 13/0004; H10N 70/231; H10N 70/8828; H10N 70/828
See application file for complete search history.

(56) References Cited

U.S. PATENT DOCUMENTS

| | | | |
|---|---|---|---|
| 7,348,268 B2 | 3/2008 | Dennison | |
| 2004/0233748 A1* | 11/2004 | Terao ................. | H10N 70/8828 257/E45.002 |
| 2005/0173691 A1* | 8/2005 | Lee ...................... | H10N 70/826 257/E45.002 |
| 2007/0200108 A1 | 8/2007 | Noh et al. | |
| 2008/0121862 A1* | 5/2008 | Liu .................... | G11C 13/0004 257/E47.001 |

(Continued)

FOREIGN PATENT DOCUMENTS

| | | |
|---|---|---|
| CN | 101101961 A | 1/2008 |

OTHER PUBLICATIONS

Preliminary Search Report for French Application No. 2012027, dated Jul. 7, 2021.

(Continued)

*Primary Examiner* — Sue A Purvis
*Assistant Examiner* — Casey Paul Boatman
(74) *Attorney, Agent, or Firm* — Wolf, Greenfield & Sacks, P.C.

(57) ABSTRACT

A phase change memory device comprising, between first and second electrodes: a first layer of a phase change material; and a second germanium nitride-based layer, in contact with the first layer, the nitrogen percentage in the second layer being between 20% and 35%, and the second layer having a channel of the phase change material of the first layer passing through it.

12 Claims, 8 Drawing Sheets

(56) References Cited

U.S. PATENT DOCUMENTS

| | | | |
|---|---|---|---|
| 2010/0301988 A1* | 12/2010 | Czubatyj | H10N 70/8825 |
| | | | 29/610.1 |
| 2017/0316822 A1* | 11/2017 | Sei | G11C 11/1659 |
| 2018/0308547 A1* | 10/2018 | Lille | H10N 70/235 |
| 2021/0125924 A1* | 4/2021 | Zhao | G11C 17/18 |

OTHER PUBLICATIONS

Hubert et al., Detailed Analysis of the Role of Thin-HfO$_2$ Interfacial Layer in Ge$_2$Sb$_2$Te$_5$-Based PCM. IEEE Transactions on Electron Devices. Jul. 11, 2013;60(7):2268-75.
Zhang et al., Unveiling the structural origin to control resistance drift in phase-change memory materials. Materials Today. Aug. 13, 2020;41:156-76.

* cited by examiner

A1.

A2.

A3.

B1.

B2.

B3.

PHASE CHANGE MEMORY DEVICE

CROSS-REFERENCE TO RELATED APPLICATIONS

This application claims priority to French application number 2012027, filed Nov. 23, 2020. The contents of which is incorporated herein by reference in its entirety

TECHNICAL FIELD

The present invention relates generally to non-volatile memories and more particularly to phase change memories (PCM) and their structure.

BACKGROUND ART

Phase change memories or PCMs are non-volatile memories drawing on the properties of phase change materials. Phase change materials have the ability to switch from a low resistive state to a high resistive state by being heated. Phase change memories take advantage of the fact that the electrical resistances of the amorphous phase of phase change materials and those of the crystalline phase are different, in order to store data.

FIG. 1 shows a partial, schematic, perspective view of a phase change memory device 1.

More particularly, FIG. 1 shows a phase change memory device 1 comprising a first electrode 13, corresponding for example to a high electrode, a layer 15 of a phase change material and a second electrode 11, corresponding for example to a low electrode.

The device 1 optionally comprises a heating element (heater) 14 between the second electrode 11 and the layer 15 of the phase change material.

One problem with the device 1 shown in FIG. 1 is that it requires a fairly large current in order to be programmed, as will now be described in more detail.

The phase change material has the ability to switch from a resistive state to a less resistive state, i.e. to a low resistive state, by heating the material under the effect of specific electrical pulses applied by means of its two electrodes 11 and 13.

Switching from a resistive state to a less resistive state corresponds to an activation operation, called SET, i.e. an operation of writing a binary data value, such as a logical value "1", and switching from a less resistive state to a resistive state corresponds to a deactivation operation, called RESET, i.e. an operation of writing an opposite binary data value, such as a logical value "0".

The volume of the layer 15 affected by the phase changes is restricted, in order to avoid using too high a current. For this, the electrode 11 or the heater 14, if applicable, is in contact with the layer 15 only over an area noted A, and the volume affected by the phase changes corresponds to a dome 19 whose base is greater than or equal to the area A. In the example shown in FIG. 1, the heater 14 has a cylindrical shape. In one embodiment, the heater 14 has a right parallelepiped shape. In one device comprising a heater 14, the heater 14 is surrounded by an insulator 16, for example, so as to increase the thermal resistance of the device and prevent heat dissipation through the edges of the heater 14.

To perform the RESET operation, the dome or volume 19 is switched to a resistive state, and, to perform the SET operation, the dome or volume 19 is switched to a low resistive state.

Each of the SET and RESET operations comprises a first so-called electronic transition, for example, during which a relatively long (of a few nanoseconds) and low-intensity electrical pulse passes through the electrodes 11 and 13. The purpose of this first transition is to have the volume 19 switch from a resistive state to a conductive state, allowing the transition of the current.

Following this, a second so-called "phase transition" takes place, when, for a SET operation, the switching of the phase material changes from a resistive state to a less resistive state is triggered or, for a RESET operation, the switching of the phase material changes from a less resistive state to a resistive state is triggered.

During the phase transition of a SET operation:
in a first step, the temperature of the phase change material reaches a temperature above the melting temperature; and
in a second step, the temperature decreases at a relatively slow rate, triggering crystallization of the volume 19.

If the rate is not slow enough during the second step, the volume 19 returns to a resistive state.

The current applied between the two electrodes 13 and 11 and the current density are connected by the formula:

$$I_{prog} = A \cdot J_{prog} \qquad \text{[Math 1]}$$

where $I_{prog}$ is the programming current 17, applied between the electrodes 11 and 13, $J_{prog}$ is the programming current density, and A, in the embodiment shown in FIG. 1, is the area between the layer 15 and the electrode 11 or between the layer 15 and the heater 14, if applicable.

Thus, in order to allow a reduction of the programming current, it would be desirable to reduce the area A. However, there remains a technical problem in achieving this objective while maintaining the same operating voltage range of the device.

SUMMARY OF INVENTION

There is a need for improvement in phase change memory devices.

One embodiment addresses all or some of the drawbacks of known of known phase change memory devices.

One embodiment provides a phase change memory device comprising, between first and second electrodes:
a first layer of a phase change material; and
a second germanium nitride-based layer, in contact with the first layer, with the atomic nitrogen percentage in the second layer being between 20% and 35%, and the second layer having a channel of the phase change material of the first layer passing through it.

According to one embodiment, the first layer comprises a dome-shaped region changing state based on the current density passing through the first layer.

According to one embodiment, the channel width is based on the nitrogen percentage in the second layer.

According to one embodiment:
the second electrode is in contact with the second layer so that the channel is in contact with the second electrode over an area determined by the channel dimensions; or
a heater is in contact with the second layer such that the channel is in contact with the heater over an area determined by the channel dimensions.

According to one embodiment, the phase change material is based on germanium, antimony and tellurium.

According to one embodiment, the second layer has a thickness of between 2 nm and 30 nm, such as between 3 nm and 25 nm.

According to one embodiment, the device comprises a fourth germanium nitride-based layer between the first electrode and the first layer.

According to one embodiment, the device comprises a third layer of a phase change material, between the second layer and the second electrode.

According to one embodiment, the third layer comprises germanium, antimony and tellurium.

According to one embodiment, the second layer comprises a plurality of sublayers, and each sublayer of the second layer has a different nitrogen percentage than the nitrogen percentages of the other sublayers of the second layer.

According to one embodiment, the second layer comprises at least one intermediate sublayer between two other sublayers, wherein the nitrogen percentage of the intermediate sublayer is greater than the nitrogen percentage of the other sublayers.

One embodiment provides a system comprising one or more devices as described, organized in an array, and a programming unit.

One embodiment provides a method for manufacturing a device as described, comprising:

forming the first and second layer; and performing an initialization operation to form the channel in the second layer.

According to one embodiment, the initialization step is performed at current intensities of between 1 μA and 1.5 mA, such as between 100 μA and 1.2 mA.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various Figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, only the materials constituting the phase change memories have been detailed. The described phase change memories can be connected to conventional integrated circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the Figures as orientated during normal use.

Unless specified otherwise, the expressions "around", "approximately", "substantially" and "in the order of" signify within 10%, and preferably within 5%.

Figure 2:
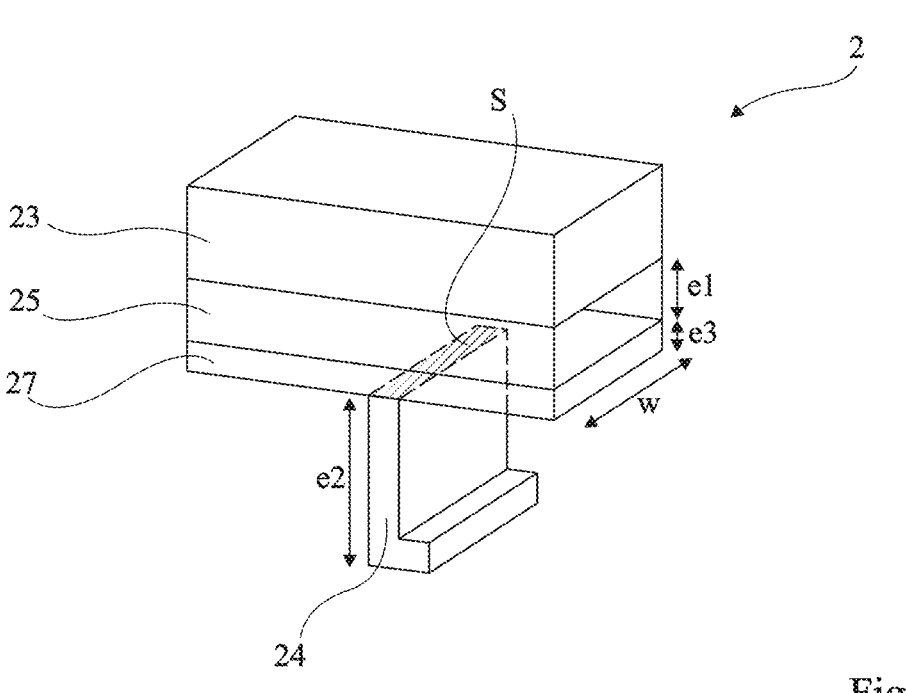
FIG. 2 is a partial, schematic perspective view of one embodiment of a phase change device.

FIG. 2 is a partial, schematic perspective view of one embodiment of a phase change device.

The device 2 comprises a first electrode 23, an optional heater 24, and a PCM layer 25 of a phase change material. The device 2 further comprises a GeN layer 27, in which one or more filaments are created by a phenomenon known as a breakdown.

The phase change material is a GST material, for example, i.e. a material composed of germanium (Ge), antimony (Sb) and tellurium (Te).

The heater 24 is made of tungsten or a titanium or tantalum-based alloy, for example.

The device 2 comprises a second or bottom electrode (not shown in FIG. 2), for example, in contact with the GeN layer 27 in the case where there is no heater 24 or, otherwise, in contact with the heater 24.

Both electrodes are metallic, for example.

The heater 24 is surrounded by an insulator (not shown in FIG. 2), for example, typically silica (SiO2) or silicon nitride (SiN). so as to increase the thermal resistance of the device and prevent heat dissipation through the edges of the heater 24.

The PCM layer 25 has a thickness e1 of between 10 nm and 200 nm, for example, equal to about 50 nm, for example. The PCM 25 and GeN layers 27 have a width w of between 3 nm and 500 nm, for example, equal to about 50 nm, for example. In FIG. 2, the heater 24 has been shown bent into an "L" shape. However, in other embodiments, it may be straight, without a bend. Further, in FIG. 2, the heater 24 extends across the entire width w of the PCM 25 and GeN layers 27. In still other embodiments, the heater 24 may be narrower than the PCM 25 and GeN layers 27. For example, the heater 24 has a thickness e2 of between 1 nm and 50 nm, equal to about 5 nm, for example.

In the example shown in FIG. 2, the GeN layer 27 is located between the PCM layer 25 and the bottom electrode, or between the PCM layer 25 and the heater 24, if applicable. The GeN layer 27 is composed of a germanium nitride (GeN) material in which a filament extends from the bottom side to the top side of the GeN layer 27. The GeN layer 27 is composed solely of germanium nitride, for example, doped more than 35 atomic percent with boron, oxygen, arsenic, carbon, or silicon or a combination of some or all of these dopants.

The heater 24 or, optionally, the bottom electrode, is in contact with the GeN layer 27 on a surface S, for example.

According to one embodiment, the filament is created during a step called "forming", at the beginning of the life of the device 2, during which a maximum voltage is applied to the device 2. Once this voltage reaches a breakdown voltage, the filament is created in the GeN layer 27. This forming step is carried out at the same time as the electronic transition, for example, and is not repeated thereafter, between device writing cycles.

The nitrogen percentage in the GeN layer 27 is chosen based on the desired breakdown voltage for the material and the desired electrical resistance for the same material. The nitrogen percentage in the GeN layer 27 will be described in more detail below, in connection with FIGS. 3 and 4. The GeN layer 27 has a thickness e3 chosen so that the breakdown voltage is sufficiently low, for example. The thickness e3 of the GeN layer 27 is then between 2 nm and 30 nm, for example, in some examples between 8 nm and 12 nm, and in other examples equal to about 10 nm.

During the forming step, and following the creation of the filament, a portion of the phase change material in the PCM layer 25 fills the interior of the filament. Thus, the GeN layer 27 includes a channel composed of the phase change material. Furthermore, this channel has a cross-sectional area of between 5 nm and 15 nm, for example, equal to about 10 nm in some examples.

The current and current density through the device 2 are then connected by the area A corresponding to the contact area between the formed filament and the heater 24 or between the formed filament and the bottom electrode, if applicable. The area A thus corresponds to a portion of the area S and is smaller than the latter.

One advantage arising from the presence of a GeN layer 27 comprising a filament extending between the phase change material layer and the bottom electrode is that the area A is reduced in relation to the contact area of a phase change material layer on and in contact with a bottom electrode or the heater 24, if applicable. This results in a current density value that can be obtained with a lower programming current.

One advantage of having a germanium nitride layer between the phase change material layer and the bottom electrode is that germanium nitride has greater chemical and physical compatibility with chalcogenide materials than oxides, which are usually used as a filament forming layer.

It is desirable to have a sufficiently low breakdown voltage of the GeN layer 27, for example, that does not exceed the voltage permitted by technology, in the range of 2 V to 4 V, for example, and a relatively low filament resistance compared to the resistance presented by the state change of the phase change material. The main elements to influence these values are the thickness e3 of the GeN layer 27 and the nitrogen percentage in the GeN layer 27. Especially when it decreases, the thickness e3 of the GeN layer 27 makes it possible to decrease the resistance.

Figure 3:
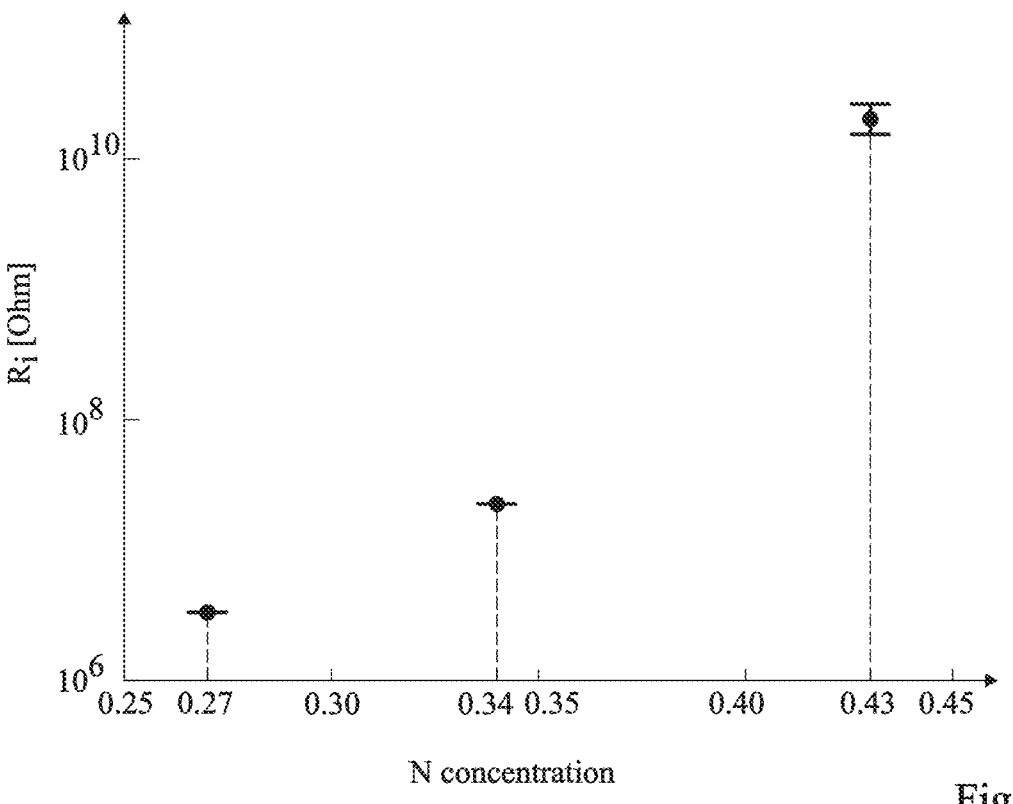
FIG. 3 is a graph showing examples of the relationship between the electrical resistance of a germanium nitride layer and the nitrogen concentration in that layer.

FIG. 3 is a graph showing the relationship between the electrical resistance of the material of the GeN layer 27 and the nitrogen concentration of the material of the GeN layer 27. The electrical resistance of the material of the GeN layer 27 was measured for GeN layers 27 with a thickness e3 of 10 nm in this example.

In FIG. 3, a 27% nitrogen percentage in the GeN layer 27 leads to a resistance of the order of $5 \cdot 10^6 \Omega$, a 34% nitrogen percentage in the GeN layer 27 leads to a resistance of the order of $5 \cdot 10^7 \Omega$ and a 43% nitrogen percentage in the GeN layer 27 leads to a resistance of the order of $5 \cdot 10^{10} \Omega$. Thus the resistance of the GeN layer 27 increases as the nitrogen amount increases.

Figure 4:
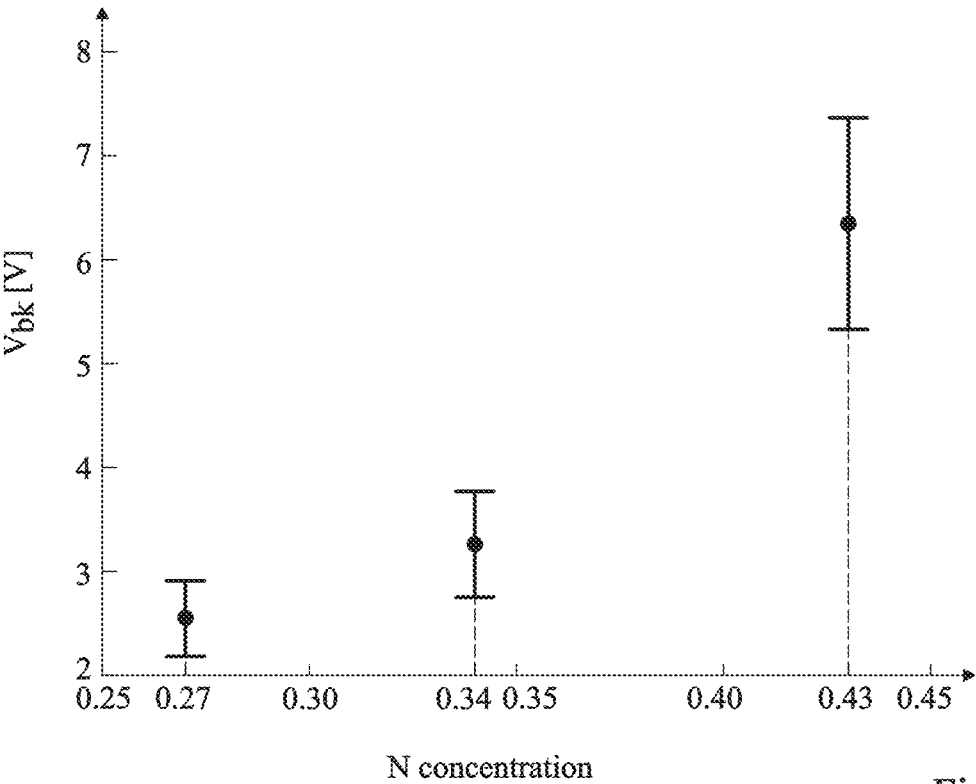
FIG. 4 is a graph showing examples of the relationship between the breakdown voltage of a germanium nitride layer and the nitrogen concentration in that layer.

FIG. 4 is a graph showing the relationship between the breakdown voltage of the material of the GeN layer 27 and the nitrogen concentration in the material of the GeN layer 27.

In FIG. 4, a 27% nitrogen percentage in the GeN layer 27 leads to a breakdown voltage in the range of 2.5 V, a 34% nitrogen percentage in the GeN layer 27 leads to a breakdown voltage in the range of 3.5 V and a 43% nitrogen percentage in the GeN layer 27 leads to a breakdown voltage in the range of 6.5 V. Thus the breakdown voltage of the GeN layer 27 increases as the nitrogen amount increases. The breakdown voltage of the GeN layer 27 was measured for GeN layers 27 with a thickness of 10 nm in this example.

According to one embodiment, the nitrogen percentage is between 25% and 35%. In this value range, the material of the GeN layer 27 exhibits improved thermal stability during electronic transition, breakdown and write cycles. The breakdown voltage in this range is also sufficiently low, and the memory window corresponding to the electrical resistance ratio of the phase change material in its resistive state to the electrical resistance of the phase change material in its less resistive state is sufficiently high that it does not reduce the memory window.

Figure 5:
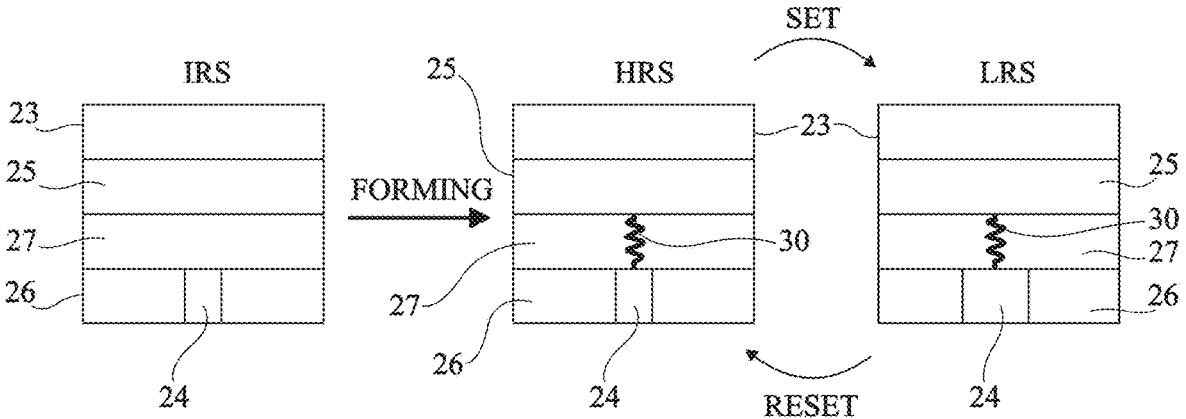
FIG. 5 is a block diagram illustrating the programming of the initialization, activation and deactivation phases of a phase change material.

FIG. 5 is a block diagram illustrating the initialization, SET, and RESET operations of the phase change material in the GeN 27 and PCM 25 layers. In FIG. 5, the heater 24 is surrounded by an insulating matrix 26, for example.

The structure of the phase change material, of the device 2 shown in FIG. 2, changes over time as the temperature imposed on the device 2 changes.

Figure 1:
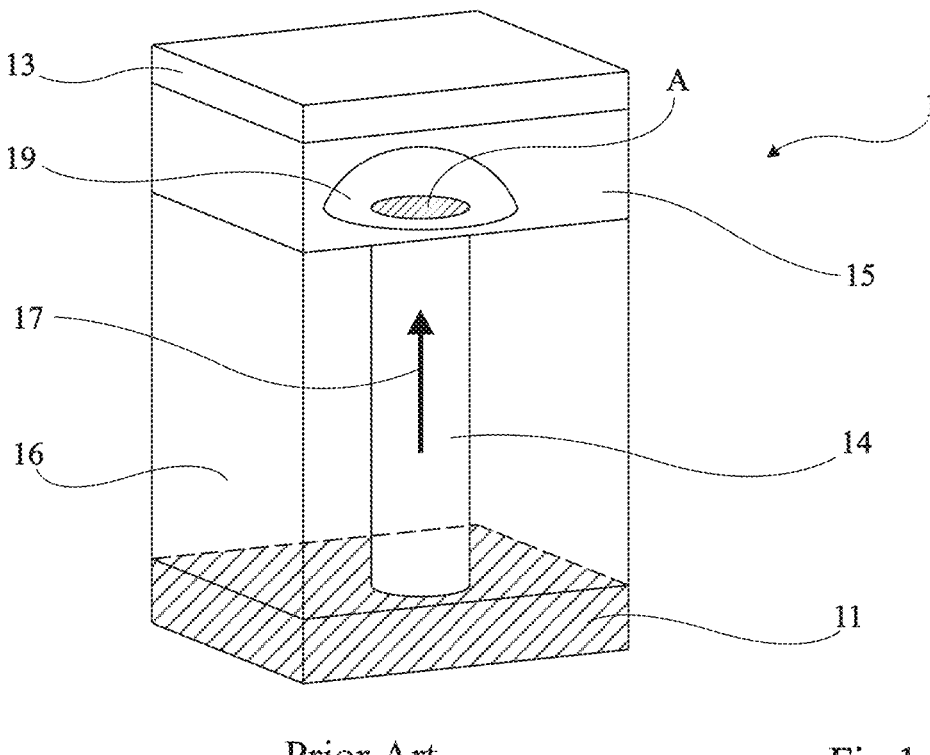
FIG. 1 shows a phase change memory device, in a partial, schematic perspective view.

As described in relation to FIG. 1, the phase change material of the device 2 is in an initial resistive state (IRS), prior to the forming step. The device 2 then undergoes initialization (FORMING), in which rapid pulses are applied to the layers 25 and 27, so that a filament is created within the GeN layer 27. During this forming, the phase change material in layer 25 is liquefied and fills the interior of the previously created filament to form a channel 30. During this forming step, the current applied through the device is limited, for example, as will be described in more detail in connection with FIG. 16.

Depending on the device cooling rate, the phase change material of the layer 25 and the channel 30 will thereafter assume either a resistive or amorphous conducting state (HRS, High Resistive State) or a less resistive state (LRS, Low Resistive State). In FIG. 5, the example of the transition to a resistive state is illustrated.

While in a high resistive state (HRS), the phase change material can evolve into a low resistive state (LRS) during a SET operation. Conversely, while in a low resistance state (LRS), the phase change material can evolve into a high resistance state (HRS) during a RESET operation. Data storage in a phase change memory is based on write cycles (SET and RESET), during which the channel 30 is maintained.

In the present description, the state called "resistive" may be an amorphous state, for example, i.e. a disordered state having a high electrical resistance, and the state called "less resistive" or "low resistive" may be a crystalline or partially crystalline state, for example, i.e. an ordered state having a lower electrical resistance.

Figure 6:
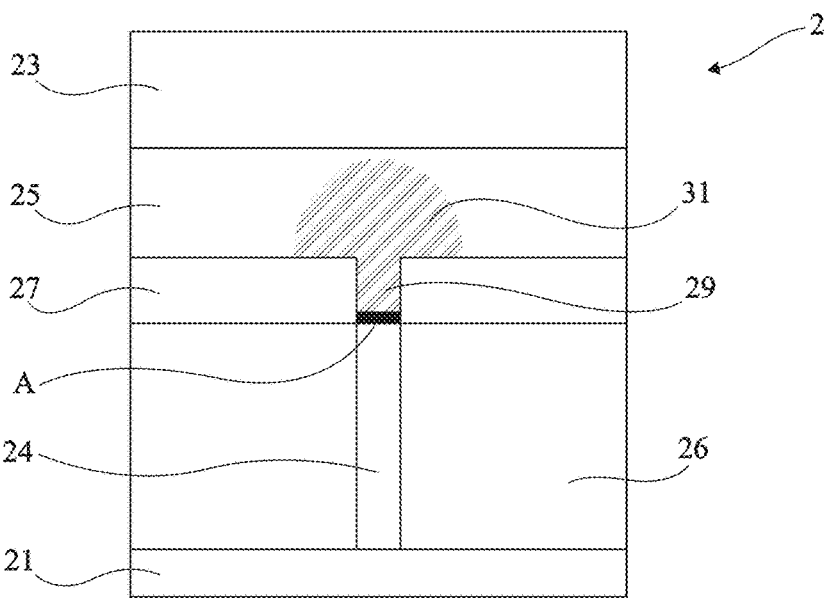
FIG. 6 is a partial, schematic cross-sectional view of the device shown in FIG. 2.

FIG. 6 is a schematic partial cross-sectional view of the device 2 illustrated in FIG. 2.

According to the embodiment shown in FIG. 6, in addition to the elements detailed in connection with FIG. 2, the device 2 includes a bottom electrode 21 and an insulating matrix 26 around the heater 24.

FIG. 6 shows the device 2 after the forming step, comprising a volume 31 in the PCM layer 25 and a volume 29 in the GeN layer 27, showing the portion of the phase change material present in the filament.

Figure 7:
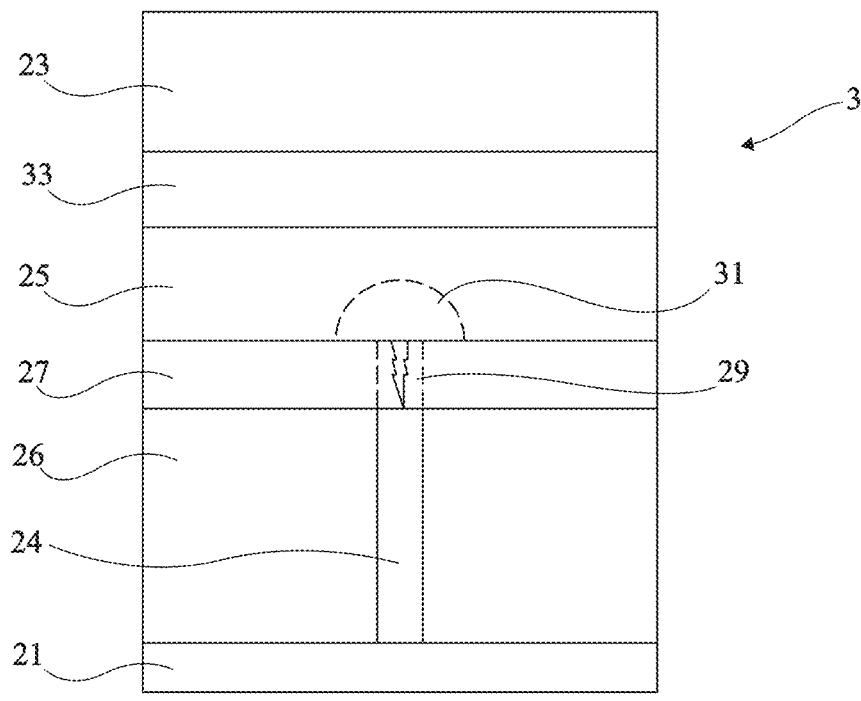
FIG. 7 is a partial, schematic cross-sectional view of a variant of the device shown in FIGS. 2 and 6.

FIG. 7 is a cross-sectional view of one variant of the device illustrated in FIG. 6.

More particularly, FIG. 7 illustrates a device 3 similar to the device 2 illustrated in FIG. 6, except that the device 3 includes a layer 33 between the electrode 23 and the PCM layer 25 of the phase change material.

According to the embodiment illustrated in FIG. 7, the layer 33 is composed of a germanium nitride-based material. The material composing the layer 33 has a higher nitrogen percentage than the nitrogen percentage of the material composing the GeN layer 27, for example, so as to increase the thermal stability of the device 3. The layer 33 is made only of doped or undoped germanium nitride, similar to the GeN layer 27, for example. The nitrogen percentage in the material of the layer 33 is greater than 35%, for example, and, according to one embodiment, about 45%. In this case, the layer 33 does not comprise a filament, for example.

According to the embodiment shown in FIG. 7, the area A, making it possible to connect the current and current density propagated through the device 3, is substantially identical to the area A of the device 2.

One advantage arising from the presence of the layer 33 between the electrode 23 and the PCM layer 25 of the phase change material is that thermal losses from the interface between the PCM layer 25 and the electrode 23 are reduced and thus thermal confinement is improved.

Figure 8:
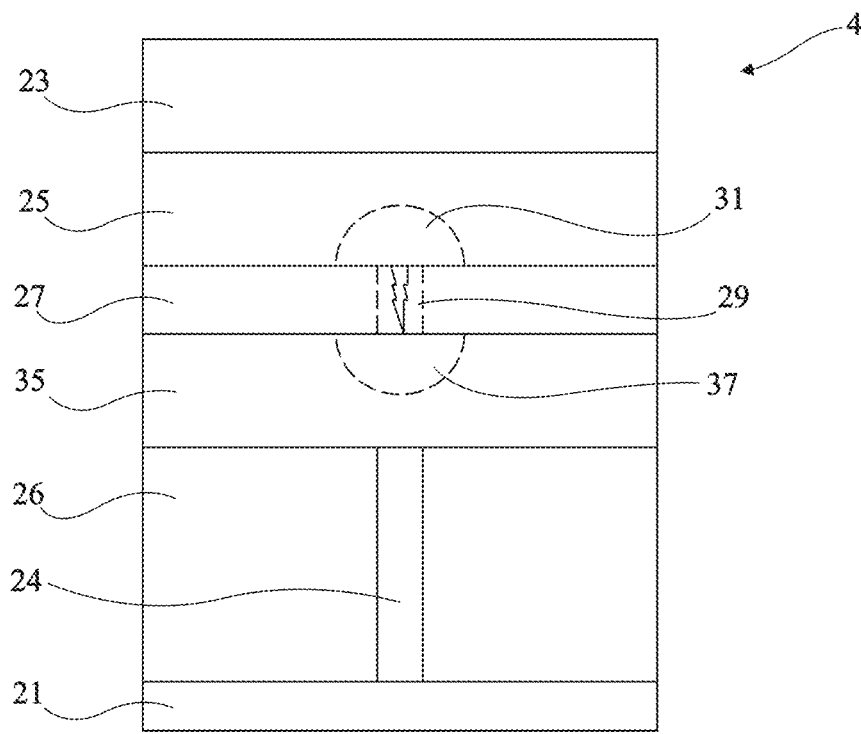
FIG. 8 is a partial schematic cross-sectional view of another variant of the device illustrated in FIGS. 2 and 6.

FIG. 8 is a cross-sectional view of another variant of the device illustrated in FIG. 6.

Specifically, FIG. 8 illustrates a device 4 similar to the device 2 illustrated in FIG. 6, except that the device 4 includes a layer 35 between the GeN layer 27 and the electrode 21 or between the GeN layer 27 and the heater 24, if the device includes a heater 24.

According to the embodiment illustrated in FIG. 8, the layer 35 is composed of a phase change material of the same nature as the PCM layer 25, for example.

According to the embodiment illustrated in FIG. 8, as the current increases passing through the device 4, the current density passing through the volume 29 becomes very large as compared to the current density passing through the rest of the device 4, due to the small width of the filament 29. As the current density passes through the volume 29, it causes a hot spot within volume 29. The phase change material around the hot spot, i.e. the phase change material in the volumes 29 and 31 and a volume 37 of the layer 35, then change their resistive state.

The volume 37 has the shape of an inverted dome, i.e. its base is at the interface between the GeN layer 27 and the layer 35.

The device 4 during the temperature increase thus comprises two axially symmetric domes, i.e. their plane faces or bases face each other.

The current and the current density passing through the device 4 are then connected by the area A corresponding to the cross-sectional area of the region 29.

One advantage arising from the presence of the layer 35 between the GeN layer 27 and the electrode 21 or heater 24 is that heat losses from the interface between the GeN layer 27 and the electrode 21 or the element 24 are reduced, due to the low thermal conductivity of the material of the layer 35.

Figure 9:
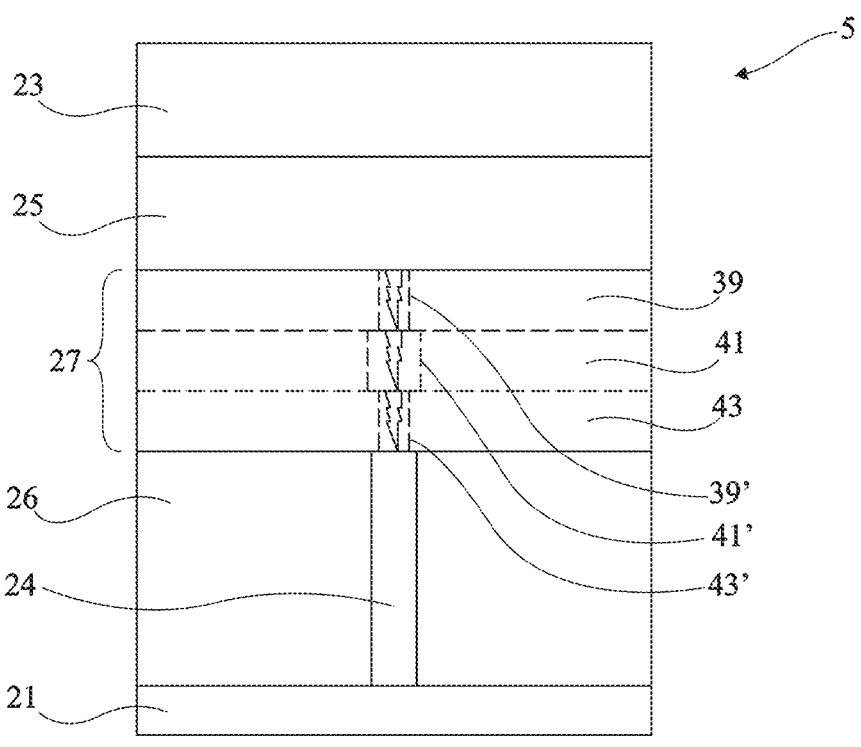
FIG. 9 is a partial, schematic cross-sectional view of still another variant of the device illustrated in FIGS. 2 and 6.

FIG. 9 is a cross-sectional view of yet another variant of the device shown in FIG. 6.

More particularly, FIG. 9 illustrates a device 5 similar to the device 2 illustrated in FIG. 6, except that the GeN layer 27 of the device 5 includes multiple germanium nitride-based sublayers in which the nitrogen percentage varies from one sublayer to the other. For example, the sublayers of the GeN layer 27 comprise only doped or undoped germanium nitride, similar to the GeN layer 27 as described in connection with FIG. 8. The nitrogen percentage in each sublayer of the layer 27 may be less than 25% or more than 35%, for example. However, the average percentage of nitrogen percentages of all sublayers of the layer 27 can advantageously be between 25% and 35%.

According to the embodiment illustrated in FIG. 9, the GeN layer 27 comprises three sublayers 39, 41, 43. However, the number of sublayers may be two, or more than three.

According to the embodiment illustrated in FIG. 9, the sublayer 39 corresponds to the top sublayer of the GeN layer 27, i.e. the sublayer in contact with the bottom face of the PCM layer 25. According to this same embodiment, the sublayer 43 corresponds to the lower sublayer of the GeN layer 27, i.e. the sublayer in contact with the upper face of the electrode 21 or the upper face of the heater 24, if applicable. Furthermore, the underlayer 41 corresponds to the intermediate layer of the GeN layer 27, i.e. it is located between the underlayer 39 and the underlayer 43.

According to the embodiment illustrated in FIG. 9, the nitrogen percentage in the sublayer 41 is higher than the nitrogen percentage in the sublayers 43 and 39.

According to the embodiment illustrated in FIG. 9, the layer 39 comprises a filament 39', the layer 41 comprises a filament 41' and the layer 43 comprises a filament 43'. In FIG. 9, the width of the filament 41' is greater than the width of the filaments 39' and 43'.

One advantage arising from the overlapping of multiple germanium nitride layers comprising different nitrogen percentages in the present embodiment is that the area A, corresponding to the contact area between the filament 43' of the layer 43 and the electrode 21 or the element 24, is better controlled.

One advantage of having the sublayers of layer the 27 organized so that the sublayer with the highest nitrogen percentage overlaps and is overlapped by sublayers having a lower nitrogen percentage is increased thermal insulation around the hot spot and thereby reducing heat loss and a decreased current density required for phase change.

In another embodiment, the nitrogen percentage of the sublayers 39, 41, and 43 may be increasing, i.e. the nitrogen percentage being greater in the sublayer 43 than in the sublayer 39.

Figure 10:
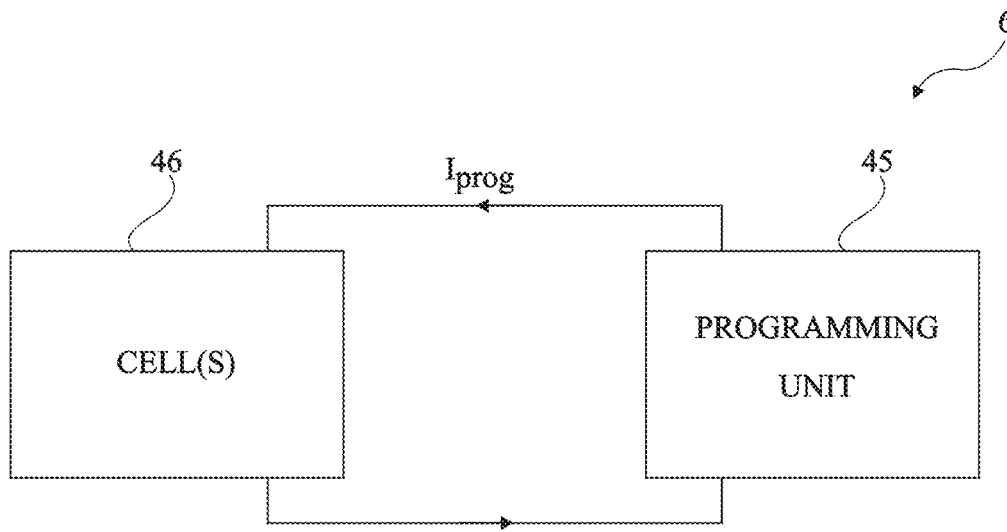
FIG. 10 is a block diagram, illustrating a phase change memory system.

FIG. 10 is a block diagram illustrating a phase change memory system 6.

Specifically, the system 6 comprises a PROGRAMMING UNIT 45 and an array 46 of one or more CELL(S). Each cell of the matrix 46 comprises a device as illustrated in FIG. 2, 6, 7, 8 or 9.

According to the embodiment, illustrated in FIG. 10, the programming unit 45 generates a current $I_{prog}$ that passes through each cell of the matrix 46. Within each cell, the device is passed through by a current density $J_{prog}$ corresponding to the current $I_{prog}$ divided by the area A.

According to one embodiment, the current density evolution propagated in the devices 2, 3 and 4, based on the time to switch the volume 31 into a less resistive state (SET operation), comprises:
a step of increasing the current density, based on the time to make the material of the volume 31 conductive; and
a step of monotonically reducing the current density, based on the time to switch the material of the volume 31 to a less resistive state.

In some embodiments, this monotonic reduction corresponds to a linear decrease. However, this form of decrease may lead to relatively time-consuming operations.

Another form of decrease making it possible to increase programming speed is described in connection with FIGS. 11 through 15.

Figure 11:
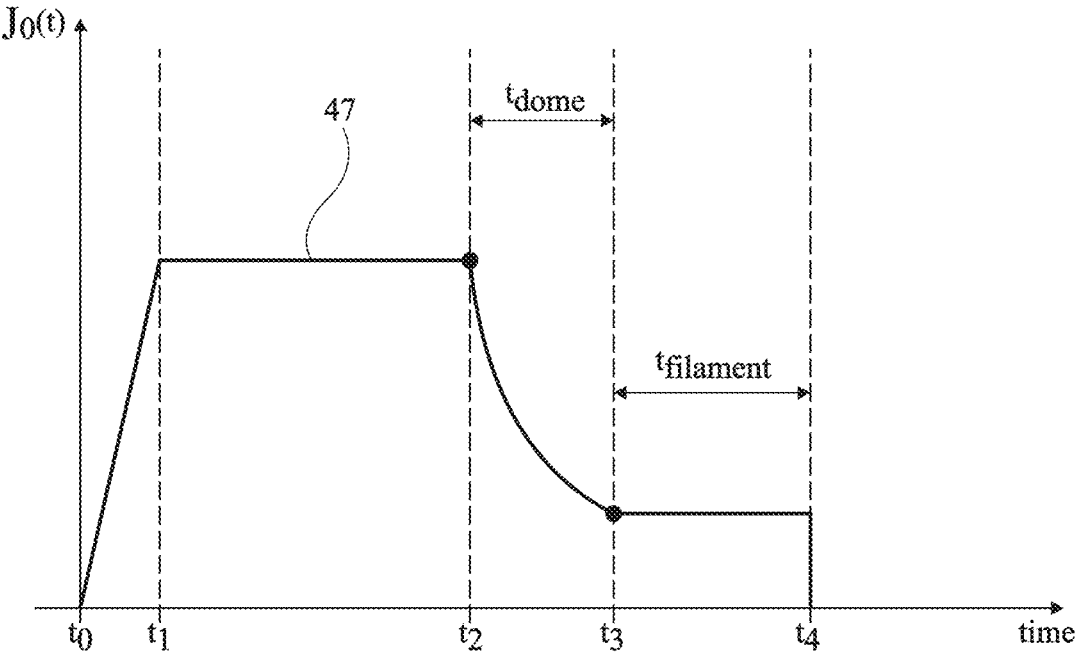
FIG. 11 shows one embodiment of the current density evolution in the devices illustrated in FIGS. 2 and 6 to 9.

FIG. 11 shows one embodiment of the evolution of the propagated current density in the devices 2 to 5 shown in FIGS. 2 and 6 to 9 based on the time to switch a portion of the materials in these devices to a less resistive state. The current density evolution propagated in the devices 2-5 to switch a portion of the materials in these devices to a low resistive state is not limited to the embodiments described below.

More particularly, FIG. 11 shows a curve 47, illustrating the evolution of the surface density of the current $J_0(t)$, imposed by a current I(t) passing through the electrodes based on the time (time).

According to the embodiment illustrated in FIG. 11, the curve 47 comprises:
a first portion of linear growth of the current density, between an moment t0 and a moment t1;
a second portion of substantially constant current density, between the moment t1 and a moment t2;
a third portion of non-linear decay of the current density, between the moment t2 and a moment t3, the time period between times t2 and t3 being named $t_{dome}$; and
a fourth portion of substantially constant current density between the moment t3 and a moment t4, the time period between t3 and t4 being named $t_{filament}$.

Figure 12:
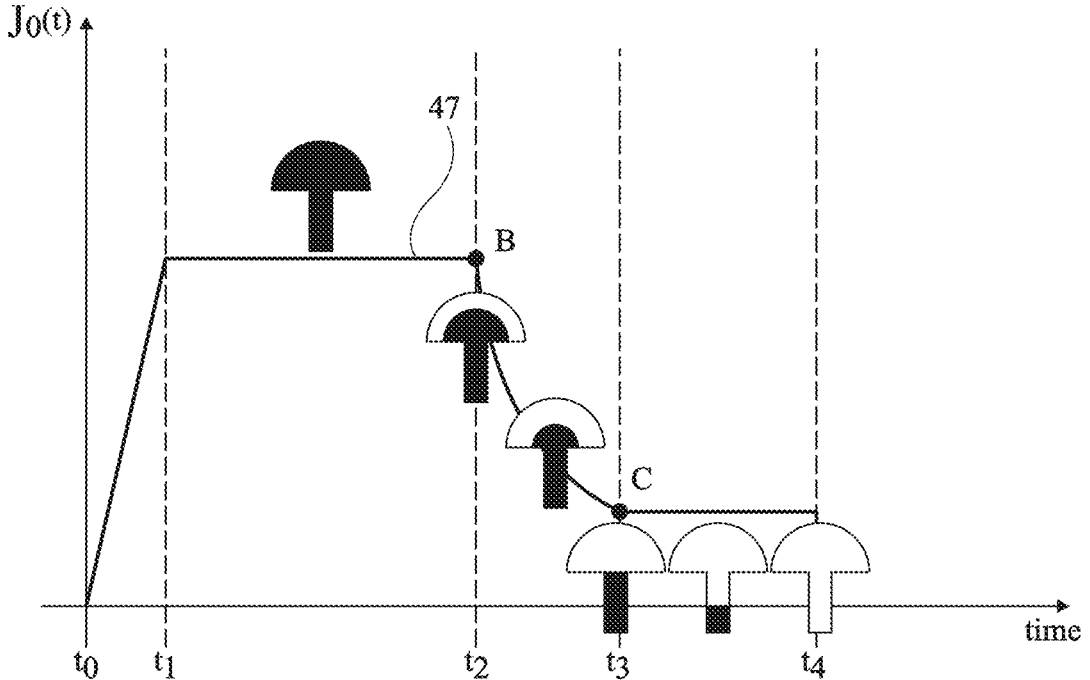
FIG. 12 shows another embodiment of the current density evolution in the devices shown in FIGS. 2 and 6 to 9.

FIG. 12 shows the same curve 47 as FIG. 11 and further shows the structural evolution of the switching in the volumes 31 and 29 (FIGS. 2, 6-8) of phase change material into a less resistive state.

At the moment to, the phase change material in the volume 31 is resistive and the current density is at level 0, for example. Between the moments $t_0$ and $t_1$, the current density increases so as to reach, a current density value, at the moment $t_1$, that will remain substantially constant until the moment $t_2$ (point B). Between the times $t_0$ and $t_2$, the phase change material of the volumes 29 and 31 becomes conductive after forming.

Between the moment t2 and moment t3, during the time period $t_{dome}$; the phase change material of the volume 31, in particular the dome corresponding to the volume 31, transitions into a less resistive state. This transition of the volume 31 into a less resistive state occurs from the outside of the volume 31 to the inside of the volume 31, i.e. from the domed side of the dome to the flat side of the dome.

During this step, a volume 37 also switches to a less resistive state if the device includes a layer 35, as shown in FIG. 8.

During the time period $t_{dome}$, the curve 47 decreases, i.e. the current density decreases based on the time. The curve 47 during this time period $t_{dome}$ follows the function:

$$J_0(t) = \frac{1}{\sqrt{Ht}} \qquad \text{[Math 2]}$$

The value H is defined, for example, by the formula:

$$H = \frac{v_g \cdot R_{th} \cdot A^2 \cdot R_h}{h \cdot (T_{melt} - T_h)} \qquad \text{[Math 3]}$$

where: $v_g$ is the crystallization speed of the phase change material, $R_{th}$ is the thermal resistance of the device, $R_h$ is the electrical resistance of the phase change material, h is the height of the PCM layer 25, $T_{melt}$ is the melting temperature of the phase change material, and $T_h$ is the temperature at the interface between the first electrode and the PCM layer 25.

The transition of the dome 31 to a less resistive state is complete when the current density satisfies, for example, the formula:

$$J_0(t) = \sqrt{\frac{T_{melt}}{R_{th} \cdot A^2 \cdot R_h}} \qquad \text{[Math 4]}$$

This current density is then reached for a time period $t_{dome}$ equal to:

$$t_{dome} = \frac{h \cdot (T_{melt} - T_h)}{v_g \cdot T_{melt}} \qquad \text{[Math 5]}$$

Thus, $t_{dome}$ is optimized for each phase change material.

At the moment t3, all the phase change material present in the volume 31 is in a low resistive state. The point on the curve 47 at the moment t3 is noted as point C.

During the time period $t_{filament}$ between the moments t3 and t4, the phase change material in the volume 29, i.e. the material present inside the filament, switches to a low-resistive state. This switching of the volume 29 occurs from the top side of the GeN layer 27 for example, that is, from the interface between the GeN layer 27 and the PCM layer 25, to the bottom side of the GeN layer 27, that is, to the interface between the GeN layer 27 and the electrode 21 or the element 24.

According to the embodiment shown in FIGS. 11 and 12, the curve 47 is constant during the time period $t_{filament}$. The time period $t_{filament}$ depends on the thickness e3 of the GeN layer 27 and thus on the filament height $h_{filament}$ and corresponds, for example, to:

$$I_{filament} = \frac{h_{filament}}{v_g} \qquad \text{[Math 6]}$$

At the moment t4, the switching into a resistive state of the phase change material of the volumes 29 and 31 into a low resistive state is finished, for example, and the current density decreases. The device is thus ready for a new writing cycle.

As an example, the time period $t_{dome}$ is between 1 ns and 1 μs and the time period $t_{filament}$ is between 1 ns and 10 μs, for a filament with a height of between 5 nm and 30 nm.

One advantage of following the above-described current density evolution depending on the time is that it ensures better crystallization of phase change material volumes, i.e. the phase change material becomes less resistive in all the considered volume.

Figure 13:
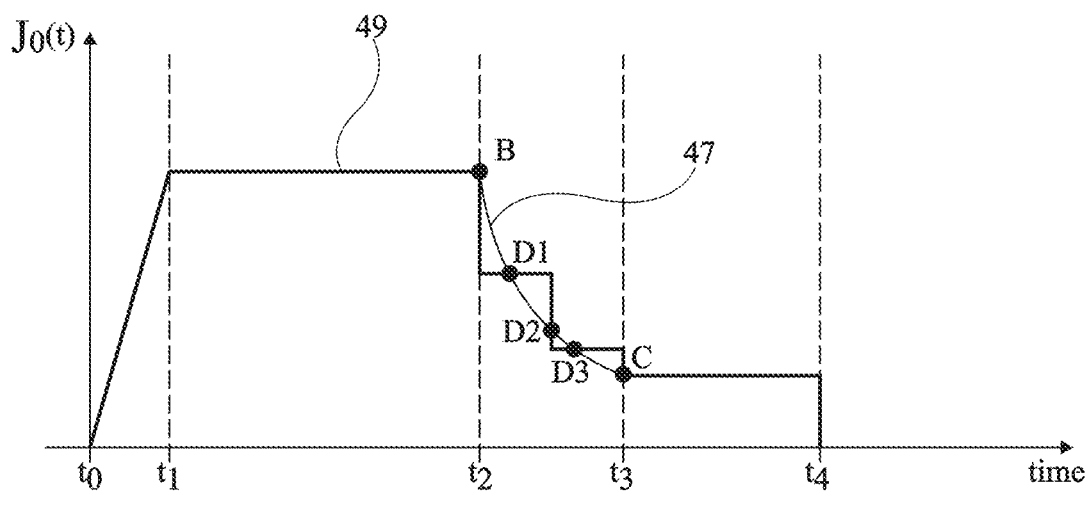
FIG. 13 shows another embodiment of the current density evolution in the devices illustrated in FIGS. 2 and 6 to 9.
Figure 14:
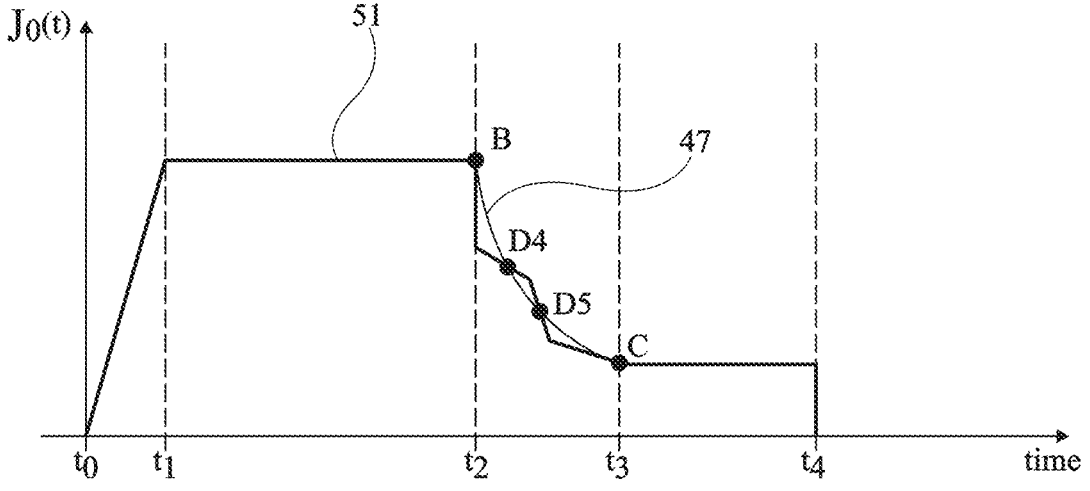
FIG. 14 shows another embodiment of the current density evolution in the devices illustrated in FIGS. 2 and 6 to 9.
Figure 15:
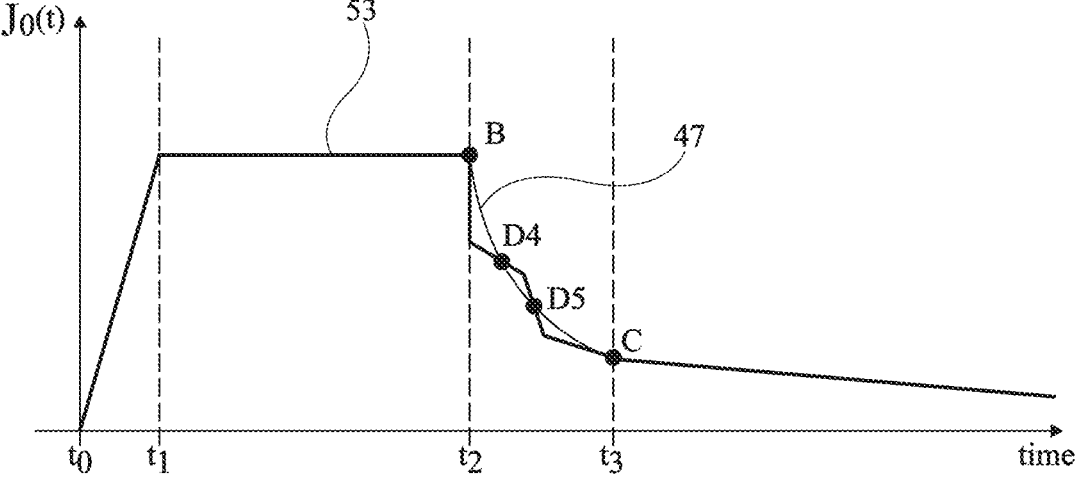
FIG. 15 shows another embodiment of the current density evolution in the devices shown in FIGS. 2 and 6 to 9.

FIGS. 13 through 15 show other embodiments of the evolution of the propagated current density in the devices 2 through 5, shown in FIGS. 2 and 6 through 9, based on the time to switch a portion of the materials in these devices to a less resistive state.

More particularly, FIG. 13 shows a curve 49, illustrating one embodiment of the current density evolution based on the time, similar to that illustrated in FIGS. 11 and 12, except that the curve 49 shown in FIG. 13 is different from the curve 47 between the moments t2 and t3.

According to the embodiment shown in FIG. 13, the curve 49 passes through the points B and C at the moments t2 and t3. In FIG. 13, the curve 49 is segmented into decreasing slots between the moments t2 and t3. In other words, the curve 49 decreases in levels between the times t2 and t3. The curve 49 comprises at least one level and intersects the curve 47 at a point D at least once, in addition to points B and C.

In FIG. 13, the curve 49 intersects the curve 47 three times between the points B and C, at the points D1, D2 and D3. However, the curve 49 can intersect the curve 47, once, twice or more than three times between the points B and C, according to one variant.

Similarly, FIG. 14 shows a curve 51 illustrating one embodiment of the current density evolution based on the time, similar to that illustrated in FIGS. 11 and 12, except that the curve 51 shown in FIG. 14 is different from the curve 47 between the moments t2 and t3.

According to the embodiment shown in FIG. 14, the curve 51 passes through the points B and C at the moments t2 and t3. In FIG. 14, the curve 51 is segmented into strictly decreasing portions between the moments t2 and t3, and intersects the curve 47 at a point D at least once, in addition to the points B and C.

In FIG. 14, the curve 51 intersects the curve 47 twice between the points B and C, at the points D4 and D5, but the curve 51 can intersect the curve 47 once, or more than twice between the points B and C, according to one variant.

Similarly, FIG. 15 shows a curve 53 illustrating one embodiment of the current density evolution based on the time, similar to that illustrated in FIG. 14, except that the curve 53 shown in FIG. 15 is different from the curve 51 after the moment t4.

According to the embodiment, illustrated in FIG. 15, the curve 53 decreases after the moment t4.

According to one embodiment, for each moment between t2 and t3, the value of the current density of the curve 47 and the value of the current density of the curves 49, 51, 53 are at most 20% different. In other words, the current density value ratio of the curve 47 to the difference between the current density values of the curves 49, 51 or 53 is between 0.8 and 1.2.

One advantage of the described embodiments and implementation methods is that they are compatible with conventional production lines for microelectronic components.

Another advantage of the described embodiments and implementation methods is that they are compatible with etching and stripping steps.

Figure 16:
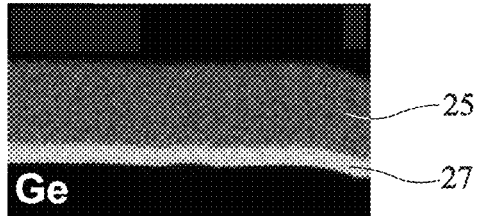
FIG. 16 shows X-ray cross-sectional views of the device shown in FIG. 6.
Figure 16:
Figure 16:
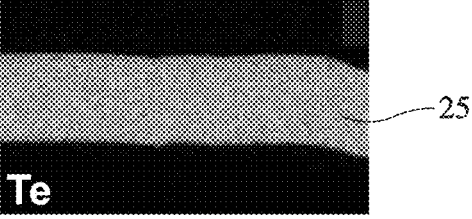
Figure 16:
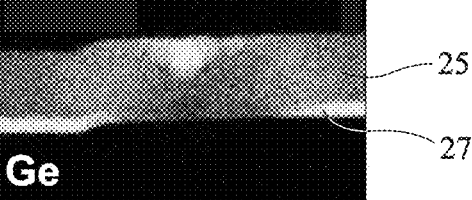
Figure 16:
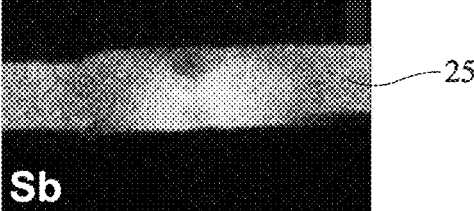
Figure 16:
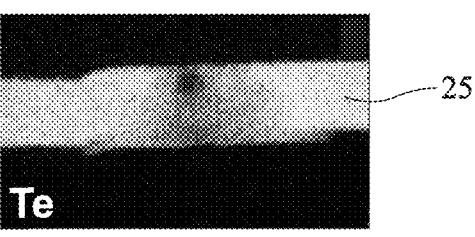

FIG. 16 shows X-ray cross-sectional views of the device 2 shown in FIG. 6.

More particularly, FIG. 16 illustrates views A1, A2 and A3 of the device 2 illustrated in FIG. 6 while a current having a first value is passing through it, and views B1, B2 and B3 of the device 2 illustrated in FIG. 6 while a current having a second value, higher than the first value, is passing through it.

The views in FIG. 16 highlight the individual components of the GST layer 25 and the GeN layer 27, using energy dispersive x-ray analysis (EDX) and transmission electron microscopy (TEM). The views A1 and B1 highlight the presence of germanium in the layers 25 and 27, the views A2 and B2 highlight the presence of antimony in the layers 25 and 27 and the views A3 and B3 highlight the presence of tellurium in the layers 27 and 25.

When the current is at the first value, germanium is located in the GST 25 layer and in the GeN layer 27, antimony is located in the layer 25 and tellurium is located in the layer 25.

When the current is at the second value, germanium is not localized homogeneously in the GST layer 25, since it is less present in the volume 31. Germanium is also not localized homogeneously in the GeN layer 27, since it is not present in the layer 27 opposite the volume 31. Antimony is not localized homogeneously in the GST 25 layer, since it is more present in the volume 31. Tellurium is not localized homogeneously in the GST 25 layer, since it is less present in the volume 31.

The inventors have found that the phenomenon illustrated in views B1, B2 and B3 is similar to melting the materials of the layers 25 and 27 at the hot spot (here, volume 31) and mixing these layers. For a lower current, illustrated here in views A1, A2 and A3, the layers 25 and 27 remain integrated and do not mix. In the case of the first current density value (in relation to views A1, A2 and A3), the layer 27 includes a channel of phase change material composed of germanium, antimony and tellurium that is too thin to be visible in views A1, A2 and A3.

The limit between these two phenomena is given by a current named $I_{lim}$ corresponding to the programming current of the device 2 if it has no layer 27, for example. In other words, the limit current corresponds to the current required to switch the material of the volume 31 from a resistive state to a less resistive state in the case where the device 2 does not have a GeN layer 27. For example, the current is less than 500 μA, less than 200 μA in some cases, equal to about 50 μA, for example.

Various embodiments and variants have been described. Those skilled in the art will understand that certain features of these embodiments can be combined and other variants will readily occur to those skilled in the art. In particular, the embodiments illustrated in FIGS. 7, 8 and 9 may be combined.

Finally, the practical implementation of the embodiments and variants described herein is within the capabilities of those skilled in the art based on the functional description provided hereinabove.

The invention claimed is:

1. A phase change memory device comprising, between first and second electrodes:

a first layer of a phase change material; and a second, germanium nitride-based layer, in contact with the first layer, with the atomic nitrogen percentage in the second layer being between 20% and 35% and the second layer having a channel of the phase change material of the first layer passing through it;

wherein the second layer comprises first and second sublayers in contact with each other, the first sublayer having a nitrogen percentage different from the nitrogen percentage in the second sublayer;

wherein the second layer comprises one or more further sublayers, and each of the first, second and further sublayers has a nitrogen percentage different from the nitrogen percentages of the other sublayers of the second layer;

wherein the second layer comprises at least one intermediate sublayer between two other sublayers, the nitrogen percentage of the intermediate sublayer being greater than the nitrogen percentage of the other sublayers.

2. The device according to claim 1, wherein the first layer comprises a dome-shaped region, changing state based on the current density passing through the first layer.

3. The device according to claim 2, wherein the channel width is based on the nitrogen percentage in the second layer.

4. The device according claim 1, comprising a third layer of a phase change material between the second layer and the second electrode.

5. The device according to claim 4, wherein the third layer comprises germanium, antimony and tellurium.

6. The device according to claim 2, wherein:

the second electrode is in contact with the second layer such that the channel is in contact with the second electrode over an area determined by the channel dimensions; or a heater electrode is in contact with the second layer such that the channel is in contact with the heater over an area determined by the channel dimensions.

7. The device according to claim 1, wherein the phase change material is based on germanium, antimony and tellurium.

8. The device according to claim 1, wherein the second layer has a thickness of between 2 nm and 30 nm, such as between 3 nm and 25 nm.

9. The device according to claim 1, comprising a fourth germanium nitride-based layer between the first electrode and the first layer.

10. A system comprising one or more devices according to claim 1, organized in an array, and a programming unit.

11. A method for manufacturing a device according to claim 1 comprising:

forming the first and second layers; and performing an initialization operation to form the channel in the second layer.

12. The method according to claim 11, wherein the forming step is performed at current intensities of between 1 μA and 1.5 mA, such as between 100 μA and 1.2 mA.

* * * * *